US012224735B2

(12) United States Patent
McHugh

(10) Patent No.: US 12,224,735 B2
(45) Date of Patent: Feb. 11, 2025

(54) DIPLEXER USING DECOUPLED TRANSVERSELY-EXCITED FILM BULK ACOUSTIC RESONATORS

(71) Applicant: Murata Manufacturing Co., Ltd., Nagaokakyo (JP)

(72) Inventor: Sean McHugh, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 560 days.

(21) Appl. No.: 17/542,284

(22) Filed: Dec. 3, 2021

(65) Prior Publication Data

US 2022/0321098 A1    Oct. 6, 2022

Related U.S. Application Data

(60) Provisional application No. 63/168,095, filed on Mar. 30, 2021.

(51) Int. Cl.
| | |
|---|---|
| *H03H 9/56* | (2006.01) |
| *H03H 9/02* | (2006.01) |
| *H03H 9/13* | (2006.01) |
| *H03H 9/17* | (2006.01) |
| *H03H 9/70* | (2006.01) |

(52) U.S. Cl.
CPC ........ *H03H 9/564* (2013.01); *H03H 9/02015* (2013.01); *H03H 9/13* (2013.01); *H03H 9/171* (2013.01); *H03H 9/706* (2013.01)

(58) Field of Classification Search
CPC ...... H03H 9/564; H03H 9/02015; H03H 9/13; H03H 9/171; H03H 9/706; H03H 3/02; H03H 9/02157; H03H 9/174; H03H 9/02228
See application file for complete search history.

(56) References Cited

U.S. PATENT DOCUMENTS

| | | |
|---|---|---|
| 5,274,345 A | 12/1993 | Gau |
| 5,446,330 A | 8/1995 | Eda et al. |

(Continued)

FOREIGN PATENT DOCUMENTS

| | | |
|---|---|---|
| WO | 2016017104 | 2/2016 |
| WO | 2018003273 | 1/2018 |

OTHER PUBLICATIONS

USPTO/ISA, International Search Report and Written Opinion for PCT Application No. PCT/US22/22405, mail date Sep. 23, 2022.

(Continued)

*Primary Examiner* — Andrea Lindgren Baltzell
*Assistant Examiner* — Kimberly E Glenn
(74) *Attorney, Agent, or Firm* — ArentFox Schiff LLP

(57) ABSTRACT

Diplexers, filter devices, and methods are disclosed. A diplexer includes a first chip comprising series resonators of a high band filter, a second chip comprising shunt resonators of the high band filter and series resonators of a low band filters, and a third chip comprising shunt resonators of the low band filter. The series resonators and the shunt resonators of the high band filter are decoupled transversely-excited film bulk acoustic resonators (DXBARs). The series resonators and the shunt resonators of the low band filter are transversely-excited film bulk acoustic resonators (XBARs).

9 Claims, 8 Drawing Sheets

©2021 RESONANT INC

(56) References Cited

U.S. PATENT DOCUMENTS

| | | |
|---|---|---|
| 5,552,655 A | 9/1996 | Stokes et al. |
| 5,726,610 A | 3/1998 | Allen et al. |
| 5,853,601 A | 12/1998 | Krishaswamy et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi et al. |
| 9,525,398 B1 | 12/2016 | Olsson et al. |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,309,865 B1 * | 4/2022 | Guyette ............. H03H 9/706 |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0042994 A1 | 3/2003 | Rosenbaum |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0349747 A1 | 12/2015 | Burak et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1 | 6/2016 | Bhattacharjee |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0259480 A1 | 8/2020 | Pensala |
| 2020/0313645 A1 | 10/2020 | Caron |
| 2020/0350891 A1 | 11/2020 | Turner |
| 2020/0412329 A1 | 12/2020 | Turner et al. |
| 2021/0013859 A1 | 1/2021 | Turner et al. |

(56) References Cited

U.S. PATENT DOCUMENTS

2021/0050843 A1    2/2021   Turner et al.
2021/0328574 A1   10/2021   Garcia

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8 Sep. 6, 2017.

R. Olsson III, K. Hattar et al. "A high electromechanical coupling coefficient SH0 Lamb wave lithiumniobate micromechanical resonator and a method for fabrication" Sensors and Actuators a: Physical, vol. 209, Mar. 1, 2014, pp. 183-190. Mar. 2014.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages. Jun. 5, 2018.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2. May 2018.

Y. Yang, A. Gao et al. "5 Ghz Lithium Niobate MEMS Resonators With High FOM of 153", 2017 IEEE 30th International Conference in Micro Electro Mechanical Systems (MEMS). Jan. 22-26, 2017. pp. 942-945 Jan. 22, 2017.

USPTO/ISA, International Search Report and Written Opinion for PCT Application No. PCT/US2019/036433 dated Aug. 29, 2019. Aug. 29, 2019.

Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja.4410690406 Jan. 1986.

Safari et al."Piezoelectric for Transducer Applications"published by Elsevier Science Ltd., pp. 4 (Year: 2000). Jan. 2000.

Buchanan "Ceramic Materials for Electronics" 3rd Edition, first published in 2004 by Marcel Dekker, Inc. pp. 496 (Year 2004). Jan. 2004.

Moussa et al. Review on Triggered Liposomal Drug Delivery with a Focus on Ultrasound2015, Bentham Science Publishers, pp. 16 (Year 2005) Jan. 2005.

Acoustic Properties of SolidsONDA Corporation592 Weddell Drive, Sunnyvale, CA 94089, Apr. 11, 2003, pp. 5 (Year 2003) Apr. 11, 2003.

Sorokin et al.Study of Microwave Acoustic Attenuation in a Multifrequency Bulk Acoustic Resonator Based on a Synthetic Diamond Single CrystalPublished in Acoustical Physics, vol. 61, No. 6, 2015 pp. 675 (Year 2015) Jan. 2015.

Material Properties of Tibtech Innovations, © 2018 Tibtech Innovations (Year 2018) Jan. 2018.

Zou, Jie "High-Performance Aluminum Nitride Lamb Wave Resonators for RF Front-End Technology" University of California, Berkeley, Summer 2015, pp. 63 (Year 2015) Jan. 2015.

Bahreynl, B.Fabrication and Design of Resonant MicrodevicesAndrew William, Inc. 2018, NY (Year 2008) Jan. 2008.

International Search Report and Written Opinion for PCT Application No. PCT/US2019/058632 dated Jan. 17, 2020. Jan. 17, 2020.

G. Manohar, Investigation of Various Surface Acoustic Wave Design Configurations for Improved Sensitivity, Jan. 2012, Doctoral dissertation, University of South Florida, USA Jan. 2012.

Ekeom, D. & Dubus, Bertrand & Volatier, A., Solidly mounted resonator (SMR) FEM-BEM simulation, 2006, 1474-1477, 10.1109/ULTSYM.2006.371. 2006.

Santosh, G. , Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Naumenko et al., "Optimal orientations of Lithium Niobate for resonator SAW filters", 2003 IEEE Ultrasonics Symposium-pp. 2110-2113. (Year: 2003) 2003.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency Saw Resonators on AlN/Diamond", IEEE Electron Device Letters, vol. 33, No. 4, Apr. 2012, pp. 495-497. Year: 2012) 2012.

Webster Dictionary, Meaning of "diaphragm" Merriam Webster since 1828. 1828.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

\* cited by examiner

DIPLEXER USING DECOUPLED TRANSVERSELY-EXCITED FILM BULK ACOUSTIC RESONATORS

RELATED APPLICATION INFORMATION

This patent claim priority to provisional patent application No. 63/168,095, filed Mar. 30, 2021, entitled N77/N79 DIPLEXER ARCHITECTURE USING DECOUPLED XBARS, which is incorporated herein by reference.

This application is related to application Ser. No. 17/408,120, filed Aug. 20, 2021, entitled DECOUPLED TRANSVERSELY-EXCITED FILM BULK ACOUSTIC RESONATORS.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
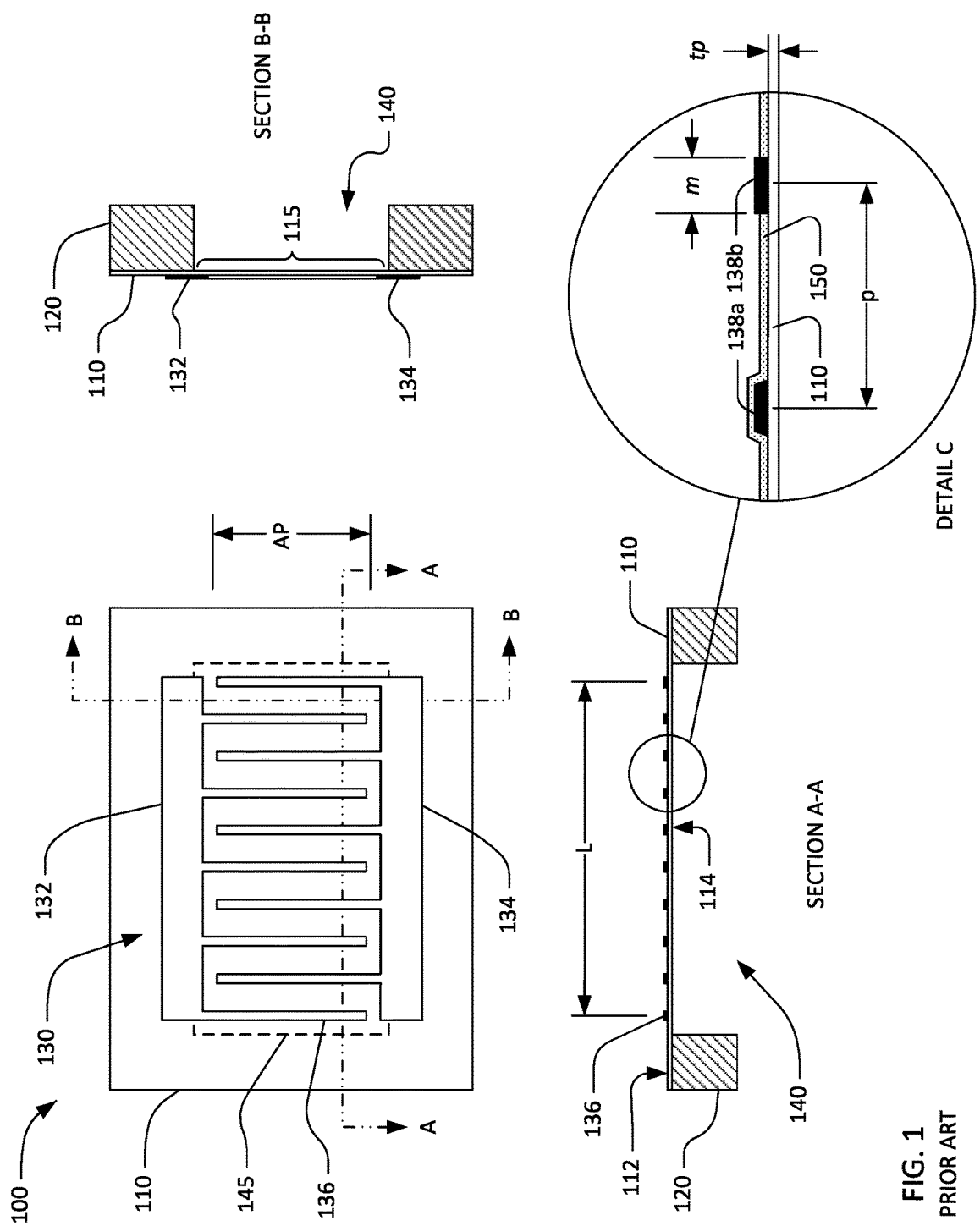
FIG. 1 includes a schematic plan view, two schematic cross-sectional views, and a detail view of a transversely-excited film bulk acoustic resonator (XBAR).

FIG. 1 shows a simplified schematic top view and orthogonal cross-sectional views of an XBAR 100. XBAR-type resonators such as the XBAR 100 may be used in a variety of RF filters including band-reject filters, band-pass filters, duplexers, and multiplexers.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be rotated Z-cut or rotated YX-cut. XBARs may be fabricated on piezoelectric plates with other crystallographic orientations.

The back surface 114 of the piezoelectric plate 110 is attached to a surface of a substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" means a conductor from which the fingers of an IDT extend. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thicknesses of the IDT fingers and the piezoelectric plate in the cross-sectional views are greatly exaggerated.

Referring now to the detailed schematic cross-sectional view (Detail C), a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide, alumina, or silicon nitride. A thickness of the front side dielectric layer 150 is typically less than about one-third of the thickness tp of the piezoelectric plate 110. The front-side dielectric layer 150 may be formed of multiple layers of two or more materials. In some applications, a back-side dielectric layer (not shown) may be formed on the back side of the piezoelectric plate 110.

The IDT fingers 138a, 138b may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of metals such as chromium or titanium may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension m is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT may be 2 to 20 times the width m of the fingers. The pitch p is typically 3.3 to 5 times the width m of the fingers. In addition, the pitch p of the IDT may be 2 to 20 times the thickness of the piezoelectric plate 210. The pitch p of the IDT is typically 5 to 12.5 times the thickness of the piezoelectric plate 210. The width m of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness of the IDT fingers may be from 100 nm to about equal to the width m. The thickness of the busbars (132, 134) of the IDT may be the same as, or greater than, the thickness of the IDT fingers. The cross-sectional shape of the IDT fingers may be trapezoidal, such as finger 138a, rectangular, such as finger 138b, or some other shape.

Figure 2:
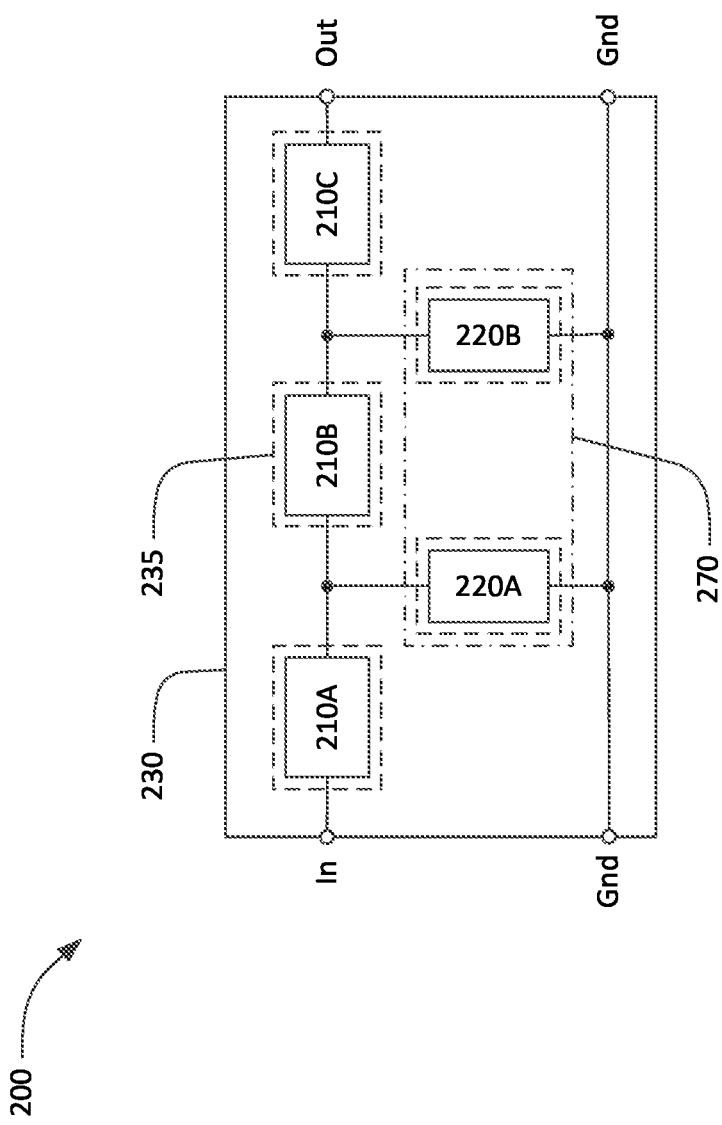
FIG. 2 is a schematic block diagram of a band-pass filter using acoustic resonators.

FIG. 2 is a schematic circuit diagram and layout for a high frequency band-pass filter 200 using XBARs. The filter 200 has a conventional ladder filter architecture including three series resonators 210A, 210B, 210C and two shunt resonators 220A, 220B. The three series resonators 210A, 210B, and 210C are connected in series between a first port and a second port (hence the term "series resonator"). In FIG. 2, the first and second ports are labeled "In" and "Out", respectively. However, the filter 200 is bidirectional and either port may serve as the input or output of the filter. The two shunt resonators 220A, 220B are connected from nodes between the series resonators to ground. A filter may contain additional reactive components, such as capacitors and/or inductors, not shown in FIG. 2. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and one of the input, the output, or a node between two series resonators.

In the exemplary filter 200, the three series resonators 210A, B, C and the two shunt resonators 220A, B of the filter 200 are formed on a single plate 230 of piezoelectric material bonded to a silicon substrate (not visible). In some filters, the series resonators and shunt resonators may be formed on different plates of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 2, the cavities are illustrated schematically as the dashed rectangles (such as the rectangle 235). In this example, each IDT is disposed over a respective cavity. In other filters, the IDTs of two or more resonators may be disposed over a single cavity.

Each of the resonators 210A, 210B, 210C, 220A, 220B in the filter 200 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 200. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband. In some filters, a front-side dielectric layer (also called a "frequency setting layer"), represented by the dot-dash rectangle 270, may be formed on the shunt resonators to set the resonance frequencies of the shunt resonators lower relative to the resonance frequencies of the series resonators. In other filters, the diaphragms of series resonators may be thinner than the diaphragms of shunt resonators. In some filters, the series resonators and the shunt resonators may be fabricated on separate chips having different piezoelectric plate thicknesses.

Lithium niobate (LN) is a preferred piezoelectric material for use in XBARs. LN has very high electromechanical coupling and is available as thin plates attached to non-piezoelectric substrates. While a wide variety of crystal orientations can be used in an XBAR, two orientations that have been used are Z-cut (Euler angles 0°, 0°, 90°) and rotated Y-cut (Euler angles 0°, β, 0° where 0°<β≤70°). Rotated Y-cut LN with 30°≤β≤38° has higher electromechanical coupling than Z-cut LN. Further, while both Z-cut and rotated Y-cut LN XBARs are susceptible to leakage of acoustic energy in the transverse direction (the direction parallel to the IDT fingers), comparatively simple structures can be used to minimize such losses in a rotated Y-cut LN XBAR. Minimizing acoustic losses in a Z-cut LN XB AR requires a more complex structure that necessitates additional fabrication steps. XBARs using rotated Y-cut LN may have fewer and smaller spurious modes than Z-cut LN XBARs.

The large difference between the resonance and anti-resonance frequencies of rotated Y-cut LN XBARs enables the design of filters with very wide bandwidth. However, the difference between the resonance and anti-resonance frequencies can be too high for some filter applications. For example, 5G NR band n79 spans a frequency range from 4400 MHz to 5000 MHz. A band n79 bandpass filter cannot be implemented with conventional rotated Y-cut LN XBARs. As previously described, the resonance frequencies of shunt resonators in a ladder filter circuit are typically just below the lower edge of the filter passband and the anti-resonance frequencies of shunt resonators are within the passband. Conversely, the anti-resonance frequencies of series resonators are typically just above the upper edge of the filter passband and the resonance frequencies of series resonators are within the passband. To achieve these two requirements, the difference between the resonance and anti-resonance frequencies of the resonators needs to be less than or equal to the filter bandwidth. The difference between the resonance and anti-resonance frequencies of a rotated Y-cut LN XB AR is about 800 MHz, which is greater than the 600 MHz bandwidth of band n79.

Figure 3:
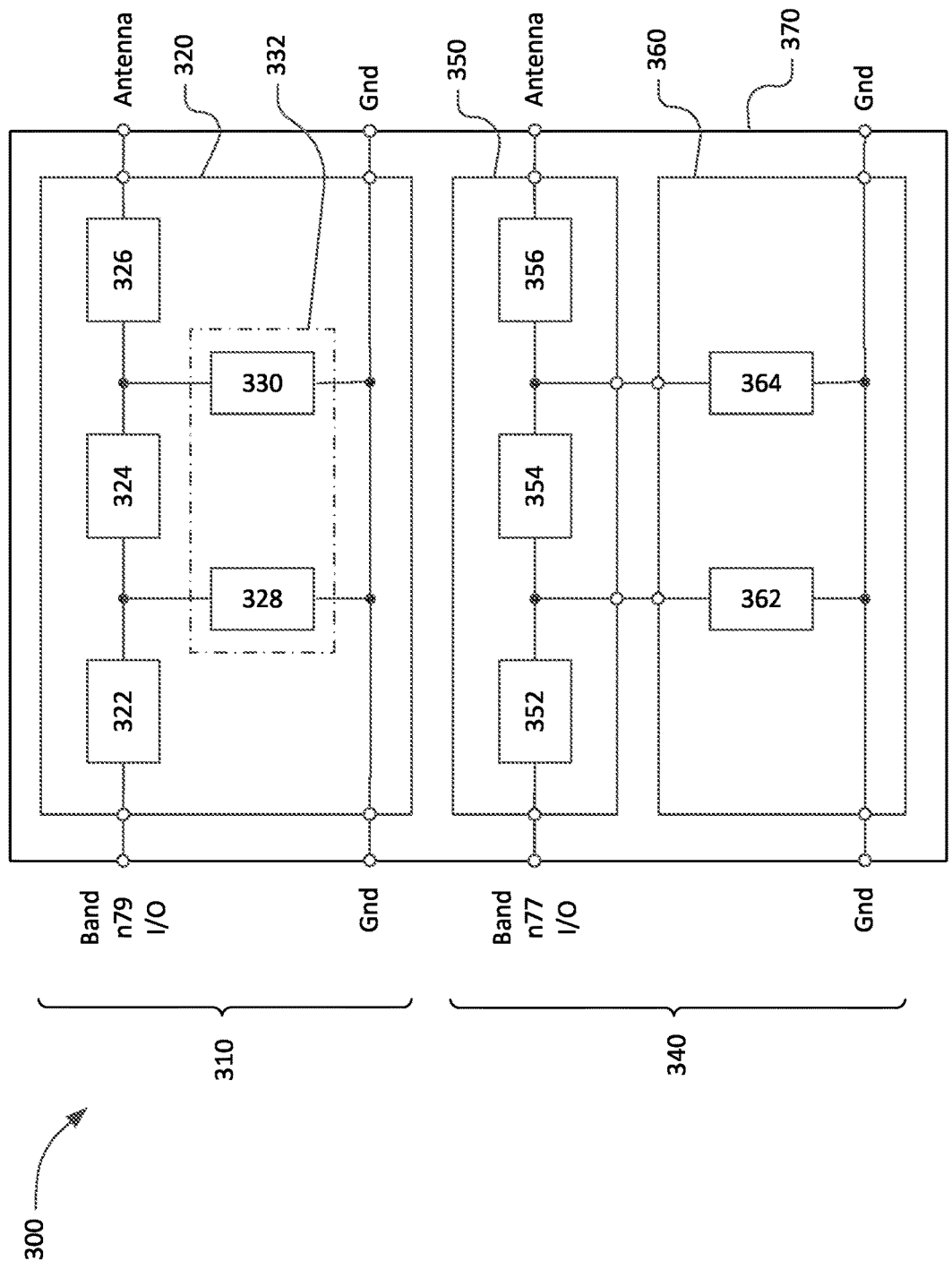
FIG. 3 is a schematic block diagram of a diplexer using XBARs.

FIG. 3 is a block diagram of a diplexer 300 to separate signals in two non-overlapping frequency bands. The diplexer 300 includes a high band filter 310 and a low band filter 340. The terms "high" and "low" refer to the relative frequency of the two bands. In this example, the low band is 5G NR band n77 and the high band is 5G NR band n79. This diplexer architecture may be used for other frequency bands.

The low band filter 310 has a first port, labeled "Band n79 I/O", and a second port, labeled "Antenna." In a typical application, the Band n79 I/O port is connected to a band n79 transceiver and the Antenna port is connected to an antenna. The low band filter 340 has a first port, labeled "Band n77 I/O", and a second port, labeled "Antenna." In a typical application, the Band n77 I/O port is connected to a band n77 transceiver and the Antenna port is connected to the same antenna as the Antenna port of the high band filter 310.

The high band filter 310, as shown, includes three series acoustic resonator 322, 324, 326 and two shunt acoustic resonators 328, 330. All of the acoustic resonators may be XBARs formed on a first chip 320 including a Z-cut lithium niobate piezoelectric plate. A high band filter may include less than five acoustic resonators and commonly may include more than five acoustic resonators. A dielectric layer 332 may be formed on the shunt resonators 328, 330 to lower the resonance frequency of the shunt resonators as previously described.

The low band filter 340, as shown, includes three series acoustic resonator 352, 354, 356 and two shunt acoustic resonators 362, 364. All of the acoustic resonators may be XBARs. A low band filter may include less than five acoustic resonators and commonly may include more than five acoustic resonators. Band n77 spans a frequency range from 3300 MHz to 4200 MHz. This broadband width necessitates a large difference between the resonance frequencies of the series resonators 352, 354, 356 and the resonance frequencies of the shunt resonators 362, 364. While the required frequency difference can be achieved using a thick dielectric layer over the shunt resonators, better filter performance may be achieved by using different piezoelectric plate thicknesses for the series and shunt resonators. To this end, the series resonators 352, 354, 356 may be fabricated on a second ship 350 and the shunt resonators 362, 364 may be fabricated on a third chip 360. The second and third chips 350, 360 may include rotated Y-cut lithium niobate piezoelectric plates. The piezoelectric plate of the third chip may be thicker than the piezoelectric plate of the second chip.

The first, second, and third chips 320, 350, 360 may be mounted on an interposer 370. The interposer may be, for example, a printed wiring board, a low temperature co-fired ceramic card, a silicon chip, or some other structure. The interposer provides electrical connections between the first, second, and third chips 320, 350, 360. The interposer includes contacts for electrical connection to circuits external to the diplexer 300. A common cover (not shown) or individual covers (not shown) may seal and protect the first, second, and third chips.

Figure 4:
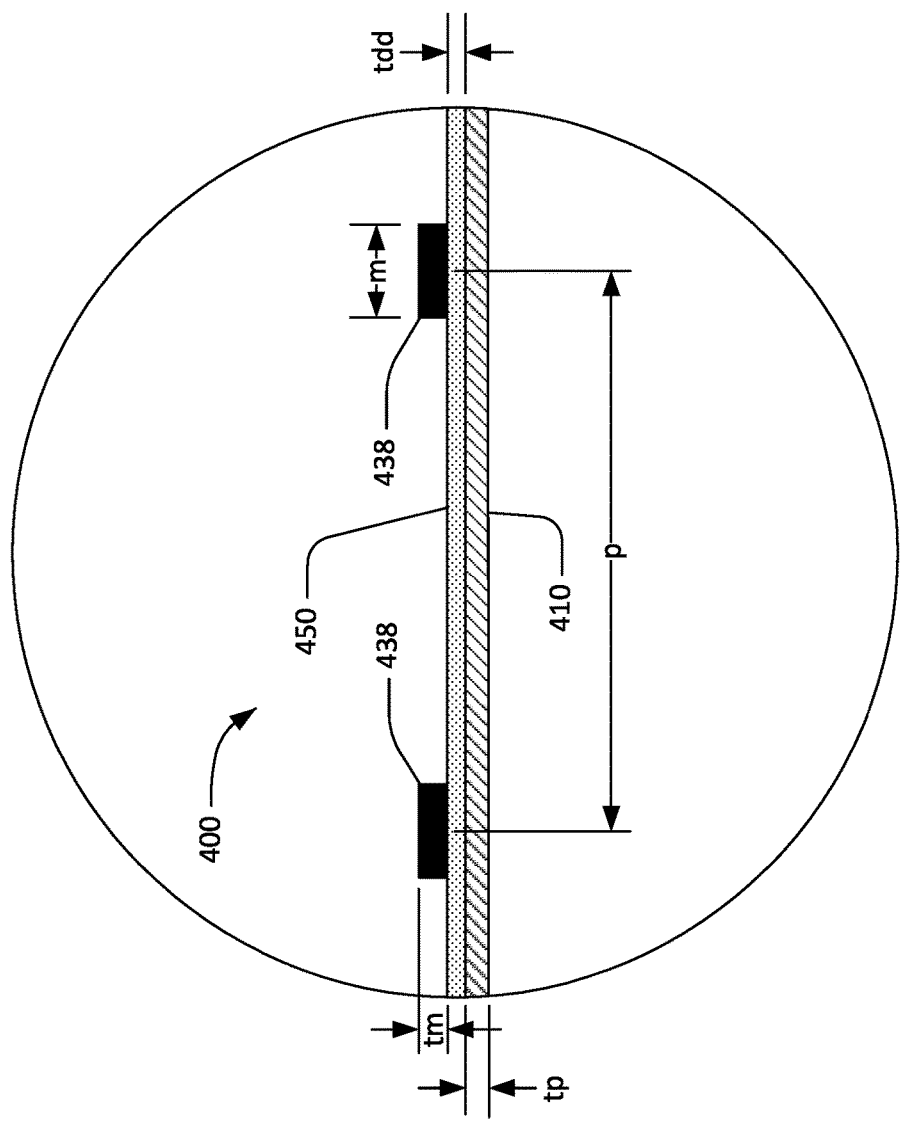
FIG. 4 is a schematic cross-sectional view of an XBAR with a decoupling dielectric layer between the IDT fingers and the piezoelectric diaphragm.

FIG. 4 is a detailed cross-sectional schematic view of a "decoupled" XBAR 400. The decoupled XBAR 400 (DX-BAR) includes a piezoelectric plate 410 having a thickness tp and IDT fingers 438 having a thickness tm, pitch p, and width m. The materials of the piezoelectric plate 410 and the IDT fingers 438 may be as previously described.

The difference between the DXBAR 400 and the XBAR 100 shown in Detail C of FIG. 1, is the presence of a dielectric layer 450 between the IDT fingers 438 and the diaphragm 410. The effect of the dielectric layer 450 is to "decouple" the XBAR 400, which is to say reduce the electromechanical coupling of the DXBAR 400. A dielectric layer such as the dielectric layer 450 will be referred to herein as a "decoupling dielectric layer". The degree of decoupling depends, in part, on a thickness tdd of the decoupling dielectric layer 450.

The decoupling dielectric layer 450 may be made of, for example, silicon dioxide, silicon nitride, aluminum oxide, or some other suitable dielectric material. In some applications, a preferred material for the decoupling dielectric layer 450 may be silicon dioxide, which provides an important secondary benefit of lowering the temperature coefficient of frequency (TCF) of the DXBAR 400 compared to the XBAR 100 of FIG. 1.

Although not shown in FIG. 4, one or more additional dielectric layers, such as the dielectric layer 150 in FIG. 1, may be formed over the IDT fingers 438 and the decoupling dielectric layer 450. The additional dielectric layers may include a frequency setting layer and/or a passivation and tuning layer that seals the surface of the device and provides sacrificial material that can be selectively removed to tune the resonance frequency.

Figure 5:
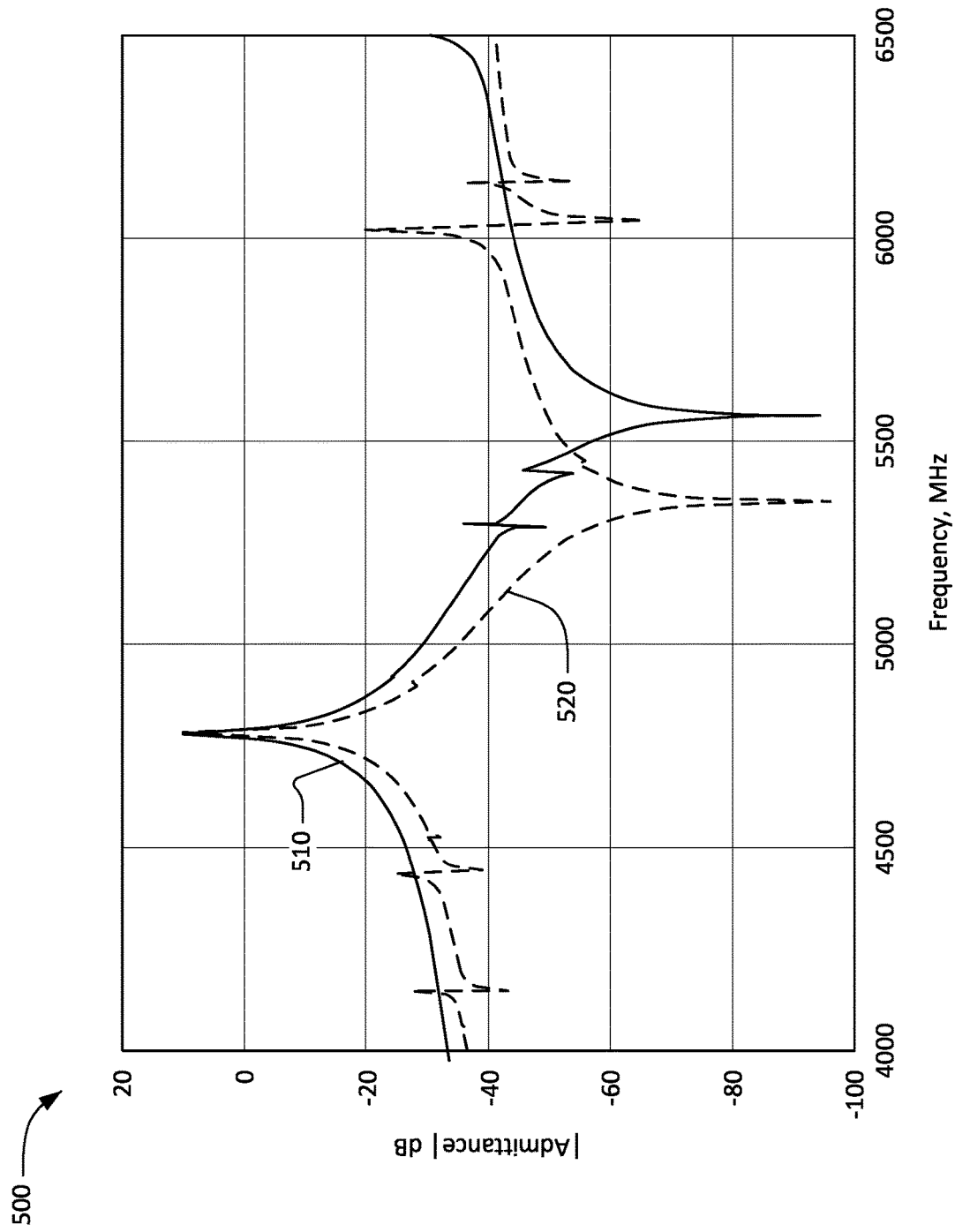
FIG. 5 is a graph comparing the magnitude of admittance for conventional and decoupled XBAR.

FIG. 5 is a graph 500 of the magnitude of admittance for two XBARs. The data shown in FIG. 5 results from simulation of the XBARs using a finite element method. Solid curve 510 is representative of an XBAR using a rotated Y-cut LN piezoelectric plate with β=30°. The resonance frequency where the admittance is maximum at about 4760 MHz and the anti-resonance frequency where the admittance is minimum at about 5560 MHz. The difference between the resonance and anti-resonance frequencies of the rotated Y-cut XBAR is about 800 MHz. A frequency difference of 800 MHz is suitable for use in a bandpass filter for band n77 but is too large for use in a bandpass filter for band n79.

Dashed curve 520 is representative of an XBAR using a Z-cut LN piezoelectric plate. Dashed curve 520 is also representative of a DXBAR using a rotated Y-cut LN piezoelectric plate (β=30°) with a suitable decoupling dielectric layer between the IDT fingers and the piezoelectric plate, as shown in FIG. 4. The resonance frequency is about 4760 MHz and the anti-resonance frequencies is about 5350 MHz. The difference between the resonance and anti-resonance frequencies of the Z-cut XB AR or DXBAR is about 590 MHz. A frequency difference of 590 MHz may be too small for use in a bandpass filter for band n77 but is suitable for use in a bandpass filter for band n79.

Photolithographic techniques may be used to pattern a decoupling dielectric layer such that the decoupling dielectric layer is present on some portions of a chip and not present on other portions. XBARs formed on the portion of the chip without a decoupling dielectric layer may have admittance characteristics similar to solid line 510. DXBARs formed on the portion of the same chip with the decoupling dielectric layer may have admittance characteristics similar to dashed line 520.

The use of a decoupling dielectric layer to reduce the electromechanical coupling of an XBAR provides the filter designer with an additional degree of freedom. The filter designer may tailor the electromechanical coupling to the requirements of a particular filter without requiring a unique cut angle for the piezoelectric plate.

Figure 6:
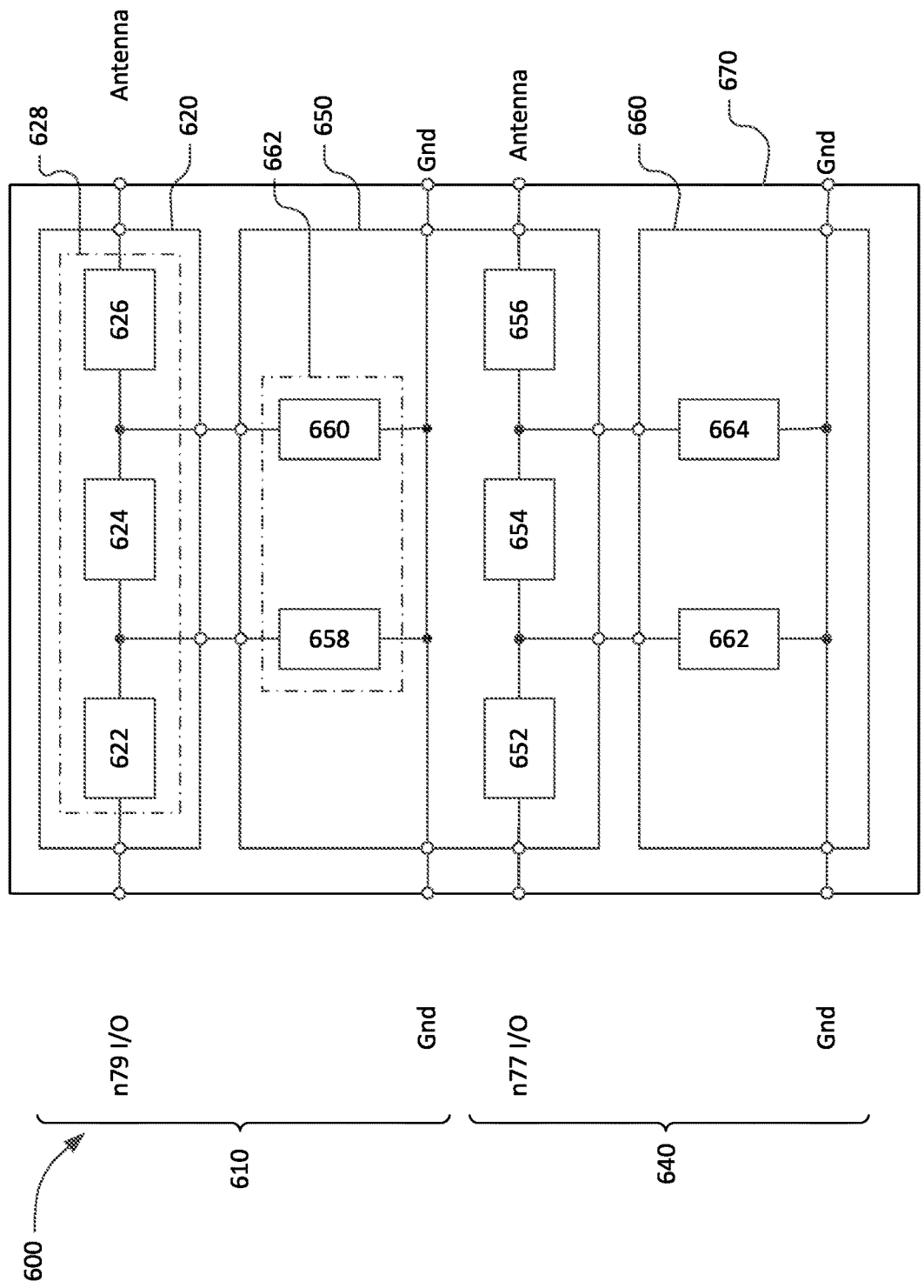
FIG. 6 is a schematic block diagram of a diplexer using conventional and decoupled XBARs.

FIG. 6 is a block diagram of a diplexer 600 using both conventional and decoupled XBARs. The diplexer 600 includes a high band filter 610 and a low band filter 640. In this example, the low band is 5G NR band n77 and the high band is 5G NR band n79. This diplexer architecture may be used for other frequency bands.

The low band filter 610 has a first port, labeled "Band n79 I/O", and a second port, labeled "Antenna." In a typical application, the Band n79 I/O port is connected to a band n79 transceiver and the Antenna port is connected to an antenna. The low band filter 640 has a first port, labeled "Band n77 I/O", and a second port, labeled "Antenna." In a typical application, the Band n77 I/O port is connected to a band n77 transceiver and the Antenna port is connected to the same antenna as the Antenna port of the high band filter 610.

The high band filter 610, as shown, includes three series acoustic resonator 622, 624, 626 and two shunt acoustic resonators 658, 660. A high band filter may include less than five acoustic resonators and commonly may include more than five acoustic resonators. The series resonators 622, 624, 626 are formed on a first chip 620 including a first lithium niobate piezoelectric plate having a first thickness. The series resonators 622, 624, 626 may be XBARs, in which case the first piezoelectric plate may be Z-cut. Alternatively, the series resonators 622, 624, 626 may be DXBARs, in which case the first piezoelectric plate may be rotated Y-cut with a decoupling dielectric layer 628. The shunt resonators 658, 660 of the high band filter 610 are decoupled XBARs formed on a second chip 650 including a rotated Y-cut lithium niobate piezoelectric plate having a second thickness and a decoupling dielectric layer 662. The second thickness may be greater than the first thickness such that the resonance frequencies of the shunt resonators 658, 660 are lower than the resonance frequencies of the series resonators 622, 624, 626.

The low band filter 640, as shown, includes three series acoustic resonator 652, 654, 656 and two shunt acoustic resonators 662, 664. A low band filter may include less than five acoustic resonators and commonly may include more than five acoustic resonators. The series resonators 652, 654, 656 are fabricated on a portion of the second chip 650 where the decoupling dielectric layer 662 is not present. The shunt resonators 662, 664 are fabricated on a third chip 660 including a rotated Y-cut lithium niobate piezoelectric plate having a third thickness and no decoupling dielectric layer. The third thickness may be greater than the second thickness such that the resonance frequencies of the shunt resonators 662, 664 are lower than the resonance frequencies of the series resonators 652, 654, 656.

The first, second, and third chips 620, 650, 660 may be mounted on an interposer 670. The interposer may be, for example, a printed wiring board, a low temperature co-fired ceramic card, a silicon chip, or some other structure. The interposer 670 provides electrical connections between the first, second, and third chips 620, 650, 660. The interposer includes contacts for electrical connection to circuits external to the diplexer 600. A common cover (not shown) or individual covers (not shown) may seal and protect the first, second, and third chips.

DESCRIPTION OF METHODS

Figure 7:
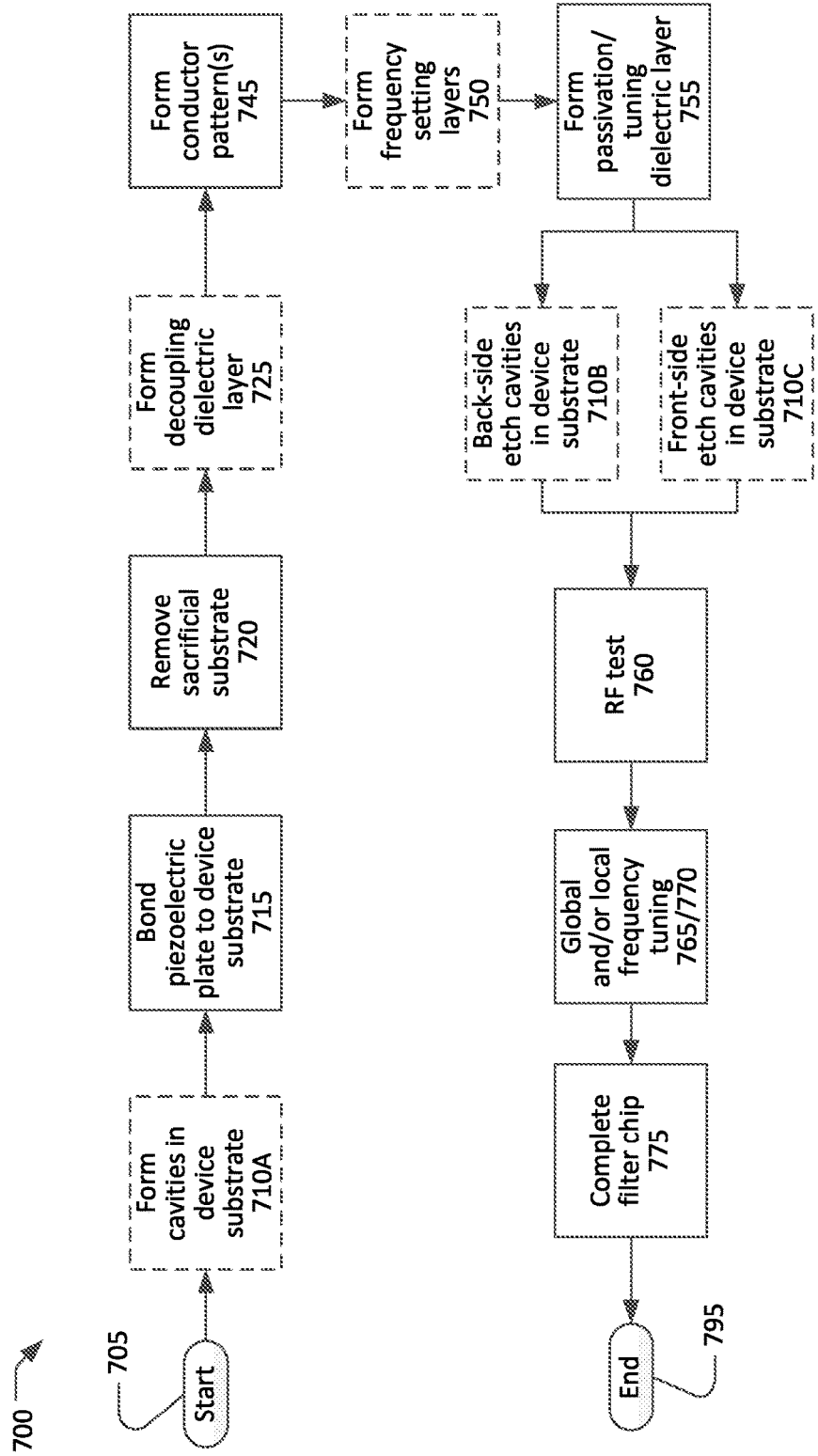
FIG. 7 is a flow chart of a method for fabricating XBARs.

FIG. 7 is a simplified flow chart summarizing a process 700 for fabricating a filter chip incorporating multiple XBARs and/or DXBARs. Specifically, the process 700 is for fabricating a filter chip including multiple XBARs, none, some, or all of which may include a decoupling dielectric layer. The process 700 starts at 705 with a device substrate and a thin plate of piezoelectric material disposed on a sacrificial substrate. The process 700 ends at 795 with a completed filter chip, which may be a complete band-pass filter or portion of a filter. The flow chart of FIG. 7 includes only major process steps. Various conventional process steps (e.g. surface preparation, cleaning, inspection, baking, annealing, monitoring, testing, etc.) may be performed before, between, after, and during the steps shown in FIG. 7.

While FIG. 7 generally describes a process for fabricating a single filter chip, multiple filter chips may be fabricated simultaneously on a common wafer (consisting of a piezoelectric plate bonded to a substrate). In this case, each step of the process 700 may be performed concurrently on all of the chips on the wafer.

The flow chart of FIG. 7 captures three variations of the process 700 for making a filter chip with XBAR and/or DXAR devices. The three process variations differ in when and how cavities are formed in the device substrate. The cavities may be formed at steps 710A, 710B, or 710C. Only one of these steps is performed in each of the three variations of the process 700.

The piezoelectric plate may typically be rotated Y-cut lithium niobate. The piezoelectric plate may be some other material and/or some other cut. The device substrate may preferably be silicon. The device substrate may be some other material that allows formation of deep cavities by etching or other processing.

In one variation of the process 700, one or more cavities are formed in the device substrate at 710A, before the piezoelectric plate is bonded to the substrate at 715. A separate cavity may be formed for each resonator in a filter chip. The one or more cavities may be formed using conventional photolithographic and etching techniques. Typically, the cavities formed at 710A will not penetrate through the device substrate.

At 715, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 720, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 720, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

Thin plates of single-crystal piezoelectric materials laminated to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. When the substrate is silicon, a layer of $SiO_2$ may be disposed between the piezoelectric plate and the substrate. When a commercially available piezoelectric plate/device substrate laminate is used, steps 710A, 715, and 720 of the process 700 are not performed.

At 725, a decoupling dielectric layer may be formed by depositing a dielectric material on the front surface of the piezoelectric plate. Forming the decoupling dielectric layer is optional. For example, a decoupling dielectric layer is not required on the third chip 660 of the diplexer 600 of FIG. 6. The decoupling dielectric layer may typically be silicon dioxide but may be another dielectric material such as silicon nitride or aluminum oxide. The decoupling dielectric layer may be a composite of two or more dielectric materials or layers of two or more dielectric materials. The decoupling dielectric layer may be patterned such that the decoupling dielectric layer is present on some portions of the piezoelectric plate and not present on other portions of the piezoelectric plate. For example, when fabricating the second chip 650 of the diplexer 600 of FIG. 6, a decoupling dielectric layer may be formed only on the portions of the chip to be occupied by the shunt resonators 658, 660 of the high band filter 610. In other filters, the decoupling dielectric layer may be formed as two or more separately-patterned layers such that different thicknesses of decoupling dielectric layer are present on different portions of the piezoelectric plate.

A first conductor pattern, including IDTs and reflector elements of each XBAR, is formed at 745 by depositing and patterning one or more conductor layers on the front side of the piezoelectric plate. All or portions of the first conductor pattern may be over the decoupling dielectric layer formed at 725. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 745 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 745 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 750, one or more frequency setting dielectric layer(s) may be formed by depositing one or more layers of dielectric material on the front side of the piezoelectric plate. While frequency setting dielectric layers are not necessarily required for the diplexer 600 of FIG. 6, the ability to have a frequency setting dielectric layer or some or all XBARs on a chip provides the filter designer with additional degrees of freedom. For example, a dielectric layer may be formed over some but not of the shunt resonators and/or series resonators of a filter to provide a greater range of resonance frequencies. The one or more frequency setting dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only selected resonators.

At 755, a passivation/tuning dielectric layer is deposited over the piezoelectric plate and conductor patterns. The passivation/tuning dielectric layer may cover the entire surface of the filter chip except for pads for electrical connections to circuitry external to the filter chip. In some instantiations of the process 700, the passivation/tuning dielectric layer may be formed after the cavities in the device substrate are etched at either 710B or 710C.

In a second variation of the process 700, one or more cavities are formed in the back side of the device substrate at 710B. A separate cavity may be formed for each resonator in a filter device. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 700, one or more cavities in the form of recesses in the device substrate may be formed at 710C by etching the substrate using an etchant introduced through openings in the piezoelectric plate. A separate cavity may be formed for each resonator in a filter device. The one or more cavities formed at 710C will not penetrate through the device substrate.

Ideally, after the cavities are formed at 710B or 710C, most or all of the XBARs and/or DXBARs on a wafer will meet a set of performance requirements. However, normal process tolerances will result in variations in parameters such as the thicknesses of dielectric layer formed at 750 and 755, variations in the thickness and line widths of conductors and IDT fingers formed at 745, and variations in the thickness of the piezoelectric plate. These variations contribute to deviations from the set of performance requirements.

To improve the yield of filter chips meeting the performance requirements, frequency tuning may be performed by selectively adjusting the thickness of the passivation/tuning layer deposited over the resonators at 755. The resonance and anti-resonance frequencies of XBARs and/or DXBARs can be lowered by adding material to the passivation/tuning layer, and the resonance and anti-resonance frequencies of XBARs and/or DXBARs can be increased by removing material to the passivation/tuning layer. Typically, the process 700 is biased to produce filter chips with resonance and anti-resonance frequencies that are initially lower than a required frequency range but can be tuned to the desired frequency range by removing material from the surface of the passivation/tuning layer.

At 760, a probe card or other means may be used to make electrical connections with the filter to allow radio frequency (RF) tests and measurements of XBAR and/or DXBAR characteristics such as admittance as a function of frequency. Typically, RF measurements are made on all, or a large sample, of the XBARs and/or DXBARs fabricated simultaneously on a common piezoelectric plate and substrate.

At 765, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the resonance and/or anti-resonance frequencies towards a desired frequency range. The test results from 760 may be processed to generate a global contour map indicating the amount of material to be removed as a function of two-dimensional position on the wafer. The material is then removed in accordance with the contour map using the selective material removal tool.

At 770, local frequency tuning may be performed in addition to, or instead of, the global frequency tuning performed at 765. "Local" frequency tuning is performed with a spatial resolution smaller than an individual filter device. The test results from 760 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter chips.

After frequency tuning at 765 and/or 770, the filter chip is completed at 775. Actions that may occur at 775 include forming bonding pads or solder bumps or other means for making connection between the device and external circuitry (if such pads were not formed at 745); excising individual filter chips from a wafer containing multiple filter devices; other packaging steps; and additional testing. After each filter chip is completed, the process ends at 795.

Figure 8:
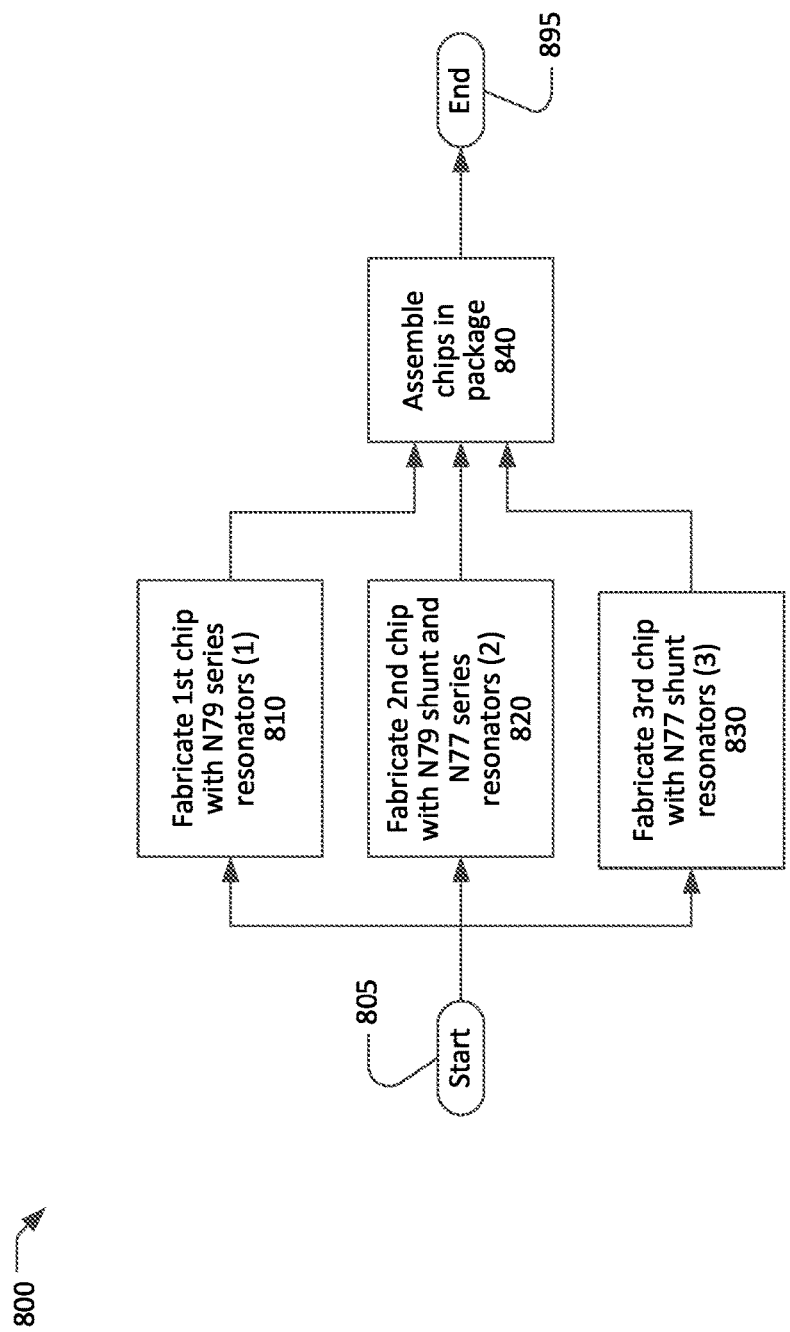
FIG. 8 is a flow chart of a method for fabricating the diplexer of FIG. 6.

FIG. 8 is a block diagram of a process 800 for fabricating a band n77/band n79 diplexer, such as the diplexer 600 of FIG. 6, using multiple filter chips with a combination of XBARs and DXBARs. The process 800 starts at 805 and ends at 895 with a completed packaged diplexer. The flow chart of FIG. 8 includes only major process steps. Various conventional process steps (e.g. surface preparation, cleaning, inspection, baking, annealing, monitoring, testing, etc.) may be performed before, between, after, and during the steps shown in FIG. 8.

At 810, a first chip containing series resonators of a band n79 bandpass filter is fabricated using a rotated Y-cut lithium niobate piezoelectric plate having a first thickness. The first chip may be fabricated using the process 700 of FIG. 7 including forming a decoupling dielectric layer at step 725. The series resonators of the band n79 bandpass filter are DXBARs.

At 820, a second chip containing shunt resonators of the band n79 bandpass filter and series resonators of a band n77 bandpass filter is fabricated using a rotated Y-cut lithium niobate piezoelectric plate having a second thickness. The second thickness is greater than the first thickness such that resonance frequencies of the shunt resonators of the band n79 bandpass filter are lower than resonance frequencies of the series resonators of the band n79 bandpass filter. The second chip may be fabricated using the process 700 of FIG. 7 including forming a decoupling dielectric layer at step 725 over only the locations of the shunt resonators of the band n79 bandpass filter. The shunt resonators of the band n79 bandpass filter are DXBARs. The series resonators of the band n77 bandpass filter are XBARs.

At 830, a third chip containing shunt resonators of the band n77 bandpass filter is fabricated using a rotated Y-cut lithium niobate piezoelectric plate having a third thickness. The third thickness is greater than the second thickness such that resonance frequencies of the shunt resonators of the band n77 bandpass filter are lower than resonance frequencies of the series resonators of the band n77 bandpass filter. The third chip may be fabricated using the process 700 of FIG. 7 without forming a decoupling dielectric layer at step 725. The shunt resonators of the band n77 bandpass filter are XBARs.

At 840, the first, second, and third chips are assembled in a common package. A variety of packaging techniques may be used. For example, the first second, and third chips may be flip-chip mounted on a common interposer. The interposer may be, for example, a printed wiring board, a low temperature co-fired ceramic card, a silicon chip, or some other interposer. A common cover may then be attached or molded in place to seal and protected the first, second, and third chips. Alternatively, individual covers may be formed or attached to each of the first, second, and third chips (for example at step 775 in the process 700) prior to mounting the chips on the interposer. In either case, the process 800 ends at 895.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A diplexer comprising:
a first chip comprising series resonators of a high band filter;
a second chip comprising shunt resonators of the high band filter and series resonators of a low band filters; and
a third chip comprising shunt resonators of the low band filter, wherein
the series resonators and the shunt resonators of the high band filter are decoupled transversely-excited film bulk acoustic resonators (DXBARs), and
the series resonators and the shunt resonators of the low band filter are transversely-excited film bulk acoustic resonators (XBARs).

2. The diplexer of claim 1, wherein
the first chip comprises a first piezoelectric plate having a first thickness,
the second chip comprises a second piezoelectric plate having a second thickness greater than the first thickness, and
the third chip comprises a third piezoelectric plate having a third thickness greater than the second thickness.

3. The diplexer of claim 2, wherein the first, second, and third piezoelectric plates are rotated Y-cut lithium niobate.

4. The diplexer of claim 1, wherein each XBAR comprises:
a diaphragm formed by a portion of a piezoelectric plate spanning a cavity in a substrate; and
a conductor pattern comprising an interdigital transducer with interleaved fingers on the diaphragm.

5. The diplexer of claim 1, wherein each DXBAR comprises:
a diaphragm formed by a portion of a piezoelectric plate spanning a cavity in a substrate;
a dielectric layer on the diaphragm; and
a conductor pattern comprising an interdigital transducer with interleaved fingers on the dielectric layer over the diaphragm.

6. The diplexer of claim 1, wherein the first, second, and third chips are mounted on and electrically connected to an interposer, the interposer comprising:
conductors to connect the first, second and third chips; and
contacts for electrical connections to circuits external to the diplexer.

7. The diplexer of claim 6, wherein the interposer comprises one of a printed circuit board, a low temperature co-fired ceramic circuit card, and a silicon chip.

8. The diplexer of claim 6, wherein the conductors connect the series and shunt resonators of the high band filter in a first ladder filter circuit and connect the series and shunt resonators of the low band filter in a second ladder filter circuit.

9. The diplexer of claim 1, wherein the high band is $5^{th}$ Generation New Radio (5G NR) band n79 and the low band is 5G NR band n77.

* * * * *